United States Patent [19]
Hall et al.

[11] Patent Number: 5,872,419
[45] Date of Patent: Feb. 16, 1999

[54] PIEZOELECTRIC TRANSFORMER WITH VOLTAGE FEEDBACK

[75] Inventors: Dale G. Hall, Cedar Crest; James R. Phillips, Albuquerque; Gary L. Vaughn, Albuquerque; Donald Forst, Albuquerque; Harold W. Mech, Albuquerque, all of N. Mex.

[73] Assignee: Motorola Inc., Schaumburg, Ill.

[21] Appl. No.: 923,652

[22] Filed: Sep. 4, 1997

[51] Int. Cl.[6] .................................................. H01L 41/08
[52] U.S. Cl. ......................... 310/359; 310/316; 310/366
[58] Field of Search .................................. 310/316, 317, 310/358, 359, 366

[56] References Cited

U.S. PATENT DOCUMENTS

| | | | |
|---|---|---|---|
| 3,736,446 | 5/1973 | Berlincourt et al. | 310/359 |
| 3,950,659 | 4/1976 | Dixon et al. | 367/159 |
| 3,958,161 | 5/1976 | Dixon | 29/25.35 X |
| 4,347,593 | 8/1982 | Trott | 310/358 X |
| 4,503,352 | 3/1985 | Inoue | 310/359 |
| 4,961,252 | 10/1990 | Hsu et al. | 29/25.35 |
| 5,341,061 | 8/1994 | Zaitsu | 310/318 |
| 5,424,602 | 6/1995 | Sato et al. | 310/359 |
| 5,504,384 | 4/1996 | Lee et al. | 310/359 |
| 5,576,590 | 11/1996 | Ohnishi et al. | 310/359 |
| 5,701,049 | 12/1997 | Kanayama et al. | 310/359 |

FOREIGN PATENT DOCUMENTS

| | | | |
|---|---|---|---|
| 47-45236 | 11/1972 | Japan | 310/359 |
| 0007687 | 1/1977 | Japan | 310/359 |

*Primary Examiner*—Mark O. Budd
*Attorney, Agent, or Firm*—Gary J. Cunningham; Colin M. Raufer

[57] ABSTRACT

A piezoelectric transformer with voltage feedback is disclosed. The transformer comprises a piezoelectric plate of predetermined length, width and height with a driving section formed by alternately stacking a plurality of piezoelectric ceramic layers having internal interdigitated electrode layers. A driven section including an unpolarized dielectric section, a voltage feedback section in the form of a multilayer electrode structure or an outer strip, and a normally polarized dielectric section is also disclosed. The transformer generates an output voltage at an output terminal by the piezoelectric vibration transmitted from the driving section. A feedback control circuit is connected to the voltage feedback section. The isolated voltage feedback provides feedback control to keep the transformer operating at the proper resonant frequency even as there is a change in output load of the transformer.

25 Claims, 5 Drawing Sheets

PIEZOELECTRIC TRANSFORMER WITH VOLTAGE FEEDBACK

FIELD OF THE INVENTION

This invention relates to piezoelectric ceramic transformers, and more particularly, to a piezoelectric transformer with voltage feedback.

BACKGROUND OF THE INVENTION

Piezoelectric transformers utilizing the piezoelectric effect are known in the art. A piezoelectric transformer can be defined as a passive electrical energy transfer device or transducer employing the piezoelectric properties of a material to achieve the transformation of voltage or current or impedance. Piezoelectric transformers have recently replaced wound-type electromagnetic transformers for generating high voltage in the power circuits for certain electronic applications. These piezoelectric transformers offer numerous advantages over ordinary electromagnetic transformers including a compact and slim shape, rugged construction, and high efficiency and reliability in a comparably smaller package. Piezoelectric transformers are particularly well suited for high voltage applications.

Piezoelectric ceramic transformers are now finding applications in a variety of applications including photocopiers, backlights for liquid crystal displays, flat panel displays, power converters, CRT displays, and the like. FIG. 1 shows the construction of a Rosen-type piezoelectric transformer, a representative example of a piezoelectric transformer of the prior art.

FIG. 1 shows a standard multilayer ceramic piezoelectric transformer 100 formed from a co-fired package of multilayer ceramic green tape interspersed with layers of a conductive metallization electrode pattern 102. Although the transformer package is made from layers of a green ceramic tape, upon firing, the transformer package sinters into a single ceramic structure. Consequently, all FIGs. will show the fired package structure and the individual layers of green tape will not be shown. An input voltage ($V_{IN}$) is applied across the electrode layers 104 creating a potential difference across the driving region 106. The driving region 106 is polarized in the direction of its thickness, as indicated by the arrows between the electrode layers 104 shown in FIG. 1.

Polarization is a process wherein a very substantial direct current (DC) voltage, in the range of 4 Kv/mm, is applied to the ceramic in order to give the material its piezoelectric properties. Similarly, a portion of the piezoelectric transformer 100 indicated by reference number 108 is a power generating or driven section. An output voltage ($V_{OUT}$) is formed on an end face 110 of the piezoelectric transformer 100 corresponding to the power generating section 108. Note that the end face 110 is metallized with a conductive coating, as is the top surface 112 in the driving section 106 of the piezoelectric transformer 100. Electrode layers 104, internal to the multilayer package, are also made from a conductive coating material The power generating section 108 is polarized in the lengthwise direction, as indicated by an arrow in FIG. 1.

With reference to FIG. 1, the basic operation of a piezoelectric transformer can be understood. When a voltage is applied to the driving section 106 of the piezoelectric transformer, the resulting electric field causes a vertical vibration due to a change in the thickness of the driving section 106 of the transformer. This vertical vibration results in a horizontal vibration in the lengthwise direction (also known as the piezoelectric transverse effect 31 mode) along the entire length of the transformer 100. In the power generating section 108 (also referred to as the driven section), a voltage having the same frequency as that of the input voltage ($V_{IN}$) is derived through the output electrode ($V_{OUT}$) in accordance with a piezoelectric effect wherein a potential difference occurs in the polarizing direction due to the mechanical strain in the polarizing direction. At this time, if the driving frequency is set to be the same as the resonant frequency of the piezoelectric transformer, a very high output voltage can be obtained. Stated another way, by applying an alternating current through the driving section 106 of the piezoelectric material, its thickness characteristics will vary, which through coupling causes a change in length of the driven section 108, which results in a change in the electrical output caused by an electro-mechanical effect.

Many prior art piezotransformers, such as the one shown in FIG. 1, measure a feedback from the output voltage ($V_{OUT}$) of the transformer. Typically, the feedback signal is sent through a feedback network, an oscillator, and an amplifier (see FIG. 1). Significant advantages, as will be discussed below, can be achieved when the feedback is measured from another location on the transformer, independent of load. Moreover, the feedback signal may more accurately track resonance when the feedback signal is isolated from the load.

A problem encountered in the manufacture of piezoelectric transformers for certain electronic applications involves assuring that the transformer is driven at its resonant frequency. The "Q" property ("Q" is defined as the center frequency divided by the bandwidth) of piezoelectric type transformers is extremely high compared to the "Q" properties of magnetic type transformers. "Q" values of several hundred or more are not unusual for piezoelectric type transformers. Since high "Q" values are associated with a narrow bandwidth, maintaining the resonant frequency for a piezoelectric type transformer (high "Q") becomes considerably more difficult than maintaining the resonant frequency for a magnetic type transformer (low "Q").

In most piezotransformer applications, the transformer must be operated at or very near its resonant frequency. In some applications, frequency errors of less than 0.5% can be detrimental and render the transformer inoperable. Thus, the ability to track frequency through a voltage feedback can be of great importance for many applications. The ability to keep a transformer "on frequency" may be necessary to assure the operation of the transformer.

Unfortunately, there are many ways in which a transformer's resonant frequency may change during operation of the device. The resonant frequency of the piezoelectric transformer may be affected by many factors such as the output load variation, drive level, mounting technique, and temperature.

A piezoelectric transformer with a voltage feedback offers a solution to this problem. It is possible to operate the transformer in closed-loop self oscillation circuit. In this case, the oscillation occurs at a frequency for which the phase at the circuit input is the same as the phase at the circuit output. Another possibility involves operating the transformer in a closed-loop oscillation circuit in which a voltage controlled oscillator (VCO) or other type of oscillator is forced to operate at a frequency determined by the phase of the feedback signal with respect to the circuit input. In both cases, the phase shift through the piezotransformer must be known so that standard phase shift networks can be used to close the feedback loop and maintain frequency stability and tracking characteristics.

Piezoelectric transformers with voltage feedbacks are known in the art. Feedback tabs are commonly described in the prior art as being necessary to provide a relatively low voltage signal in lieu of the high voltage output ($V_{OUT}$) of the transformer. Moreover, feedback tabs are also necessary to provide a signal with a constant phase relationship with respect to the input drive signal ($V_{IN}$) of the transformer. This allows the resonant frequency of the transformer to be maintained. However, prior art voltage feedback designs have some fundamental drawbacks, as will be described below, which render them inapplicable for many piezotransformer applications.

In prior art piezotransformers, a percentage of the output voltage or current is oftentimes used for the feedback signal Because the phase of the output signal, with respect to the input drive signal, can change as the load varies, such an approach may only be employed for a constant load.

Also, in prior art piezotransformers where feedback tabs are used, the feedback signal is not truly independent of the load. This is due to the fact that the feedback signal reflects some of the phase changes that occur as the load changes.

Still another drawback with prior art piezotransformers is that the voltage feedback tab is physically located in an area of the transformer which couples energy from the input drive signal. In other words, the prior art feedback tabs are located in the driving section of the transformer. This has the adverse effect of allowing higher order harmonics to be fed back to the input section making it difficult to track resonance.

Additionally, another drawback with the prior art is that the feedback tab is physically located in an area of the transformer which supports spurious vibration modes. Moreover many prior art transformers have physical dimensions which do not suppress spurious vibration modes.

If a piezotransformer having a feedback voltage could be made independent from the output voltage, such that the phase of the feedback voltage with respect to the drive voltage was constant at resonance, then the resonant frequency for varying loads could be maintained.

A piezoelectric transformer with a voltage feedback section (voltage feedback tab) which can be used to keep the transformer "on resonance" and which is isolated by its strategic placement in the driven section of the transformer and which provides feedback control in the form of a feedback voltage which has a constant phase relationship for varying loads at resonance relative to the input voltage and which reduces harmonics at a frequency of interest and which provides a low-cost solution to a complicated frequency tracking problem by reducing the number of required electronic components would be considered an improvement in the art.

DETAILED DESCRIPTION OF A PREFERRED EMBODIMENT

Figure 1:
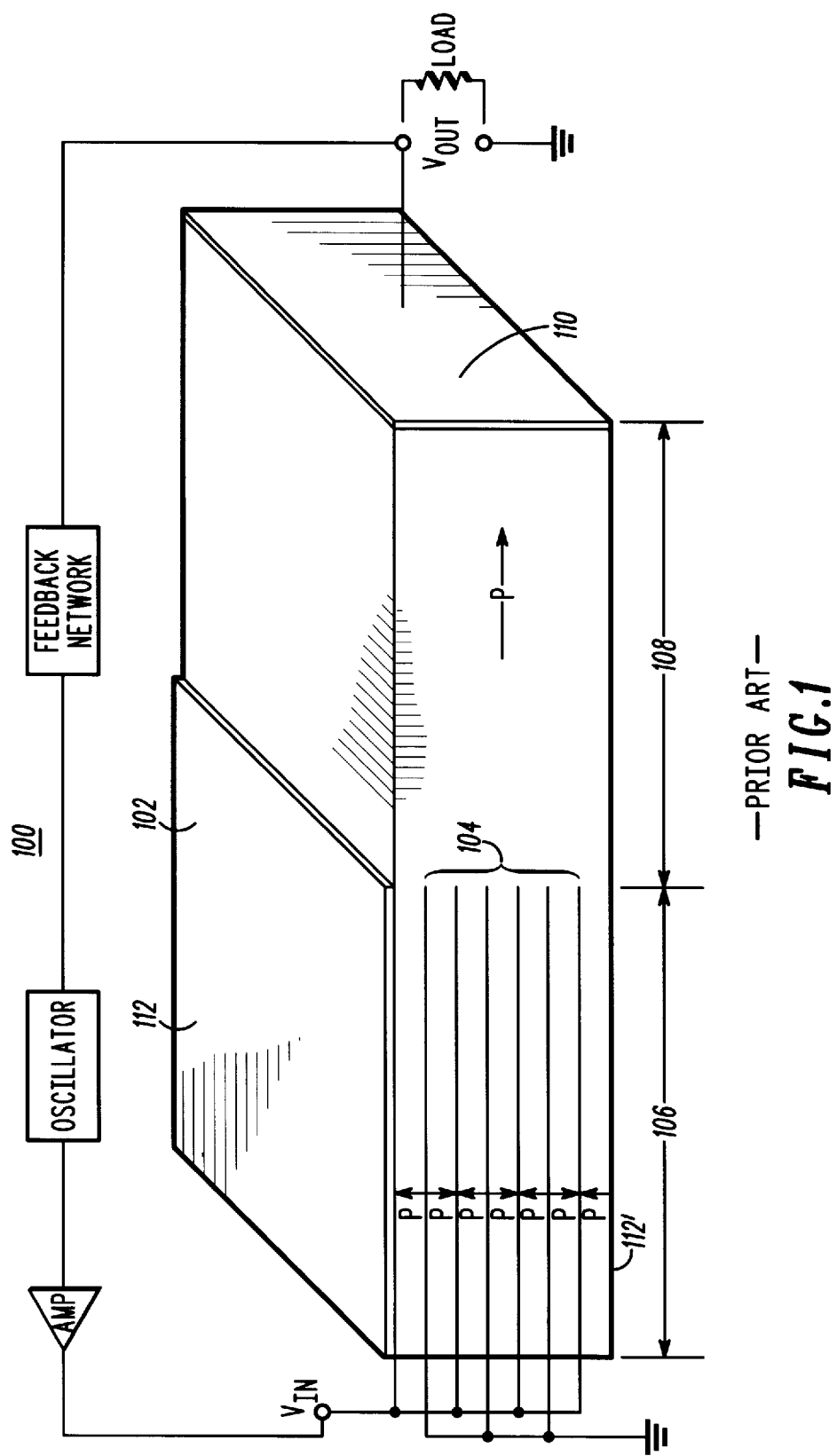
FIG. 1 shows a piezoelectric transformer in accordance with the prior art.
Figure 2:
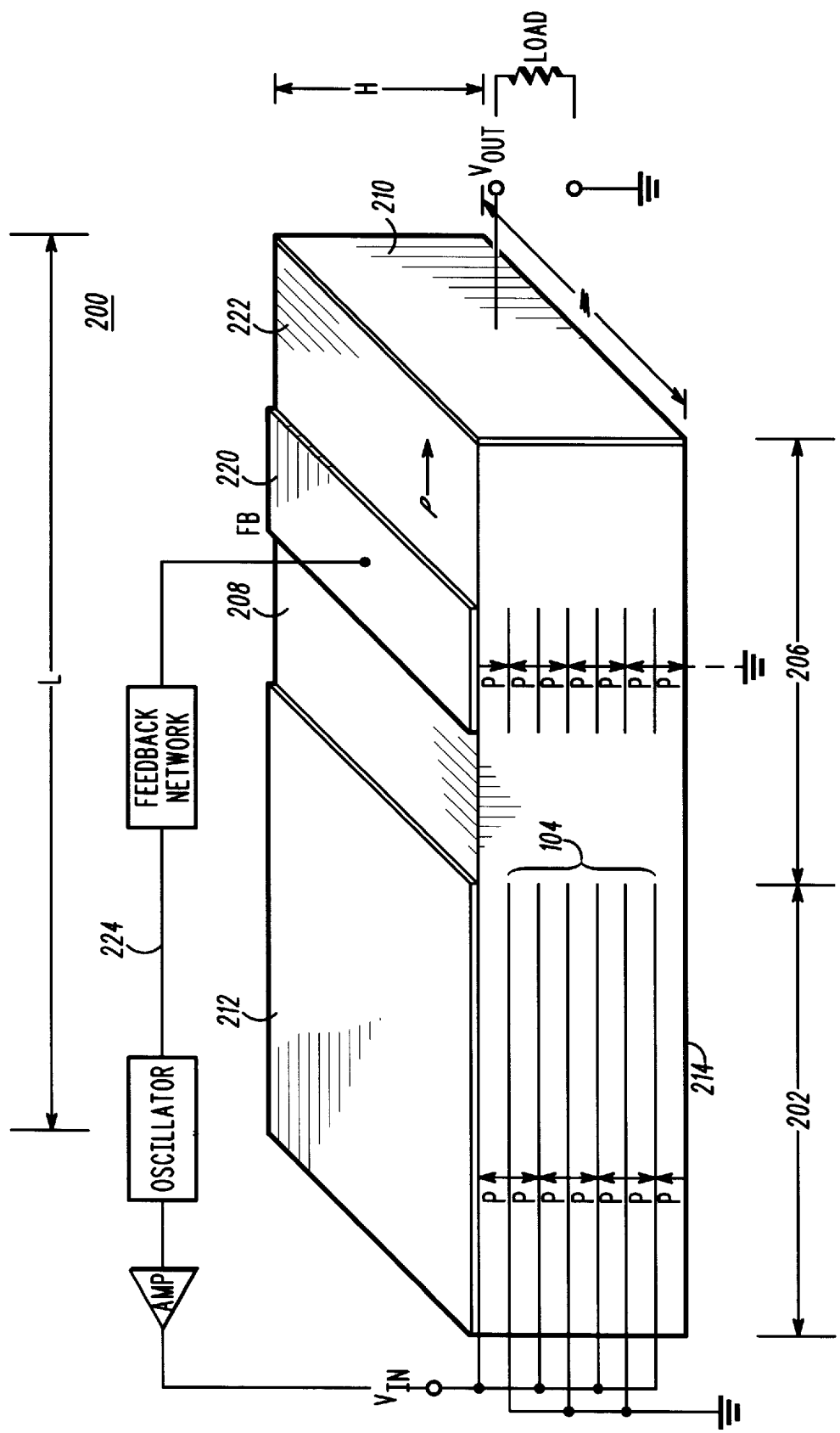
FIG. 2 shows a piezoelectric transformer with a voltage feedback in accordance with the present invention.

FIG. 2 shows a piezoelectric transformer 200 with an isolated voltage feedback. Significantly, the voltage feedback is measured from a voltage feedback section 220 on the driven section 206 of the transformer 200 which is isolated from the voltage output ($V_{OUT}$) measured on an end surface 210 of the transformer 200. In this embodiment, transformer 200 is made from a plurality of stacked layers of green ceramic tape which upon firing sinter into a dense block of ceramic material. A dense piezoelectric plate with a predetermined length (L), width (W), and height (H), and made of a piezoelectric ceramic material is thus formed as shown in FIG. 2. A driving section 202 is provided and operates when an input voltage ($V_{IN}$) is applied across a set of electrode layers 204 creating a potential difference in the driving region 202. The driving section 202 is about one-half of the overall length of the piezoelectric plate. Electrode layers 204 are formed from a conductive paste material and provide an interdigitated electrode pattern internal to the piezoelectric package. The driving section 202 is polarized in the direction of its thickness, as indicated by the arrows between electrode layers 204 shown in FIG. 2. Driving section 202 causes a piezoelectric vibration when a driving voltage is applied as an input voltage ($V_{IN}$). The top surface 212 and the bottom surface 214 of the driving section 202 of the piezoelectric transformer 200 are also covered with a conductive coating.

A driven section 206 is about one-half the length of the piezoelectric plate and includes an unpolarized dielectric section 208 (also called a "dead zone") having no internal electrodes. Although the "dead zone" will not contain internal electrodes, it may or may not be polarized depending upon specific design considerations. In a preferred embodiment, unpolarized dielectric section 208 is longitudinally adjacent to driving section 202. The unpolarized dielectric section 208 comprises a plurality of piezoelectric ceramic layers and transmits a piezoelectric vibration from the driving section 202 to a voltage feedback section 220 and a normally polarized dielectric section 222.

Voltage feedback section 220 has internal interdigitated electrode layers which are separate sheets of dielectric material which are polarized in the direction of thickness of the piezoelectric plate. The polarization scheme is shown with a set of arrows in FIG. 2. It should be noted that the voltage feedback section 220 of the embodiment shown in FIG. 2 has electrode layers throughout the multilayer piezoelectric transformer structure.

The normally polarized dielectric section 222 has a predetermined length and is made from piezoelectric ceramic layers polarized in a direction normal to the thickness direction of the piezoelectric plate. The polarization of the normally polarized dielectric section 222 is shown with an arrow in FIG. 2. The normally polarized dielectric section 222 is longitudinally adjacent to the voltage feedback section 220. Also, the normally polarized dielectric section 222 generates an output voltage ($V_{OUT}$) on the end face 210 of the piezoelectric transformer 200 by the piezoelectric vibration transmitted from the driving section 202.

Also shown in FIG. 2 is a feedback control circuit 224 which connects the voltage feedback section 220 with the input signal ($V_{IN}$) of the transformer. Referring to FIG. 2, the feedback control circuit 224 consists of a feedback network, an oscillator, and a power amplifier. The feedback network may be either active or passive and the oscillator may be either a self-oscillator or a driven-oscillator. The purpose of the control circuit is to provide an input signal at constant phase at a resonant frequency of the piezoelectric transformer In the present invention, the voltage feedback section 220, also called a voltage feedback loop, an isolated tab or voltage feedback tab, serves the function of providing feedback control to allow the transformer to be operated at its resonant frequency. It should be noted that the voltage feedback is measured from an output on a section which is in the driven section 206 or power generating section of the transformer 200. This is significant because it is the signal from the driven section 206 which is desirably measured. Significantly, the feedback control circuit 224 is isolated from the output voltage ($V_{OUT}$) on the end face 210 of the piezoelectric transformer 200. Moreover, the voltage feedback provides what is essentially a second output voltage in the driven section, albeit an output voltage which is typically much less than the output voltage ($V_{OUT}$) taken from an end face 210 of the transformer.

The voltage feedback signal must pass through a feedback control circuit before it is sent back to the voltage input ($V_{IN}$) thus completing the feedback loop. Thus, it is an important aspect of the present invention that a control circuit, typically consisting of a feedback network (active or passive), an oscillator (self or driven), and a power amplifier, will be in line with the voltage feedback section 220.

Another interesting aspect of the present invention involves the fact that the voltage feedback section 220 may also provide the feature of preventing harmonics at the frequency of interest. One challenge is that harmonics may often interfere with the resulting signal coming from a typical voltage feedback. However, the present invention solves this problem by strategic placement of the voltage feedback section 220 in the driven section 206 of the piezoelectric transformer 200, such that the feedback signal for the resonant mode of interest is strengthened and the signal for other spurious modes are weakened.

In a preferred embodiment of the present invention, the voltage feedback section 220 (also called a voltage feedback strip) will be comprised of a plurality of electroded layers which may be disposed on every layer of the multilayer structure which defines the piezoelectric transformer. Significantly, the voltage feedback section 220 in FIG. 2 is composed of a series of feedback electrodes which may be placed through every layer of the transformer 200. As such, the voltage feedback section 220 contains a greater electroded area and consequently provides a much greater capacitance between the dielectric layers which make up the piezoelectric transformer 200.

Another significant design consideration in the manufacture of the piezoelectric transformer of the present invention involves the distance which the voltage feedback section 220 is placed away from the driving section 202. In other words, the length of the unpolarized dielectric section 208 may be another important design consideration. The unpolarized dielectric section 208 may also be referred to as a "dead zone". In a preferred embodiment, the voltage feedback section 220 will be sufficiently separated from the driving section 202 such that capacitive coupling (between the driving section 202 and the voltage feedback section 220) is minimized. In one embodiment of the present invention, the unpolarized dielectric section 208 has a length which is about four times greater than the height of one layer of dielectric tape which form the piezoelectric plate. In still another embodiment of the present invention, the voltage feedback section 220 is strategically positioned at a displacement node at the second order resonant mode. This may be necessary to prevent leads from becoming detached from the piezoelectric transformer 200 and to prevent excessive mass loading of the transformer.

The electrode pattern (metallization pattern) of the voltage feedback section is still another important design consideration. Similar to the electrodes of the driving section of the transformer, the voltage feedback section 220 may have internal interdigitated electrode layers. The interdigitated electrode design allows consecutive layers to be connected to opposite side surfaces of the transformer thus have an opposite charge applied to each consecutive layer. A potential difference is then created between consecutive layers of dielectric material.

It may be possible to employ two different electroding schemes to the voltage feedback section 220. In one embodiment, the internal interdigitated electrode layers of the driving section 202 and the internal interdigitated electrode layers of the voltage feedback section 220 are both charged either positively or negatively. With this configuration, both sections, namely the driving section 202 and the voltage feedback section 220, may both be polarized in a single operation. In another embodiment of the present invention, the electrode layers of the driving section 202 may have a different charge than the electrode layers of the voltage feedback section 220. When this occurs, polarization becomes a two-step operation. Regardless of the actual electrode charging configuration, an important feature of the present invention involves the fact that the electrode layers are present throughout entire multilayer structure in the region defining the voltage feedback section 220 for the transformer 200 in FIG. 2.

Another important aspect of the present invention involves a feedback control circuit which is connected to the voltage feedback section 220 (the voltage feedback strip) and sends a signal back to an input voltage ($V_{IN}$) terminal. The feedback control circuit provides an input signal at constant phase at the resonant frequency of the piezoelectric transformer. Additionally, although higher order frequencies are often introduced by the non-sinusoidal nature of the drive electronics, the voltage feedback design of the present invention actually filters the higher order harmonic modes such that there is only one zero crossing per cycle.

Another interesting aspect of the present invention involves the fact that the external dimensions of the piezotransformer were carefully selected to improve the performance of the voltage feedback section 220. In addition to the strategic placement of the voltage feedback section 220 in the driven section 206 of the transformer 200, the corresponding length, width and height dimensions of the transformer become important parameters in the design of the transformer. Certain predetermined length to width ratios, for example, are necessary to assure the proper functioning of the piezotransformer 200 in general, and of the voltage feedback section 220 in particular. Thus, the external dimensions of the device are also important parameters in the design of a piezoelectric transformer with an isolated voltage feedback.

A predetermined length to width ratio for the piezoelectric transformer may be provided to minimize the harmonic modes and improve the efficiency of the transformer In one embodiment, a length to width ratio of 4:1 may be used. In another embodiment, a length to width ratio of 8:1 may be used. For example, a thinner, longer piezotransformer, with a higher length to width ratio, may be required for a lower frequency transformer application. The scope of the present invention, however, is not intended to be limited to these two ratios. Depending upon specific applications involving unique harmonic scenarios, other predetermined length to width ratios may be employed.

The grounding configuration of the voltage feedback section 220 in the driven section 206 of the transformer 200 is still another interesting aspect of the present invention. Voltage feedback section 220 may or may not be grounded with a physical attachment. In fact, for certain embodiments, it may be preferable not to physically ground the voltage feedback section, but to rather leave it floating. Thus, the ground in FIG. 2 is shown as a dashed line. The decision on how to ground the voltage feedback section 220 may effect the both the voltage feedback signal and the overall performance of the transformer.

Figure 3:
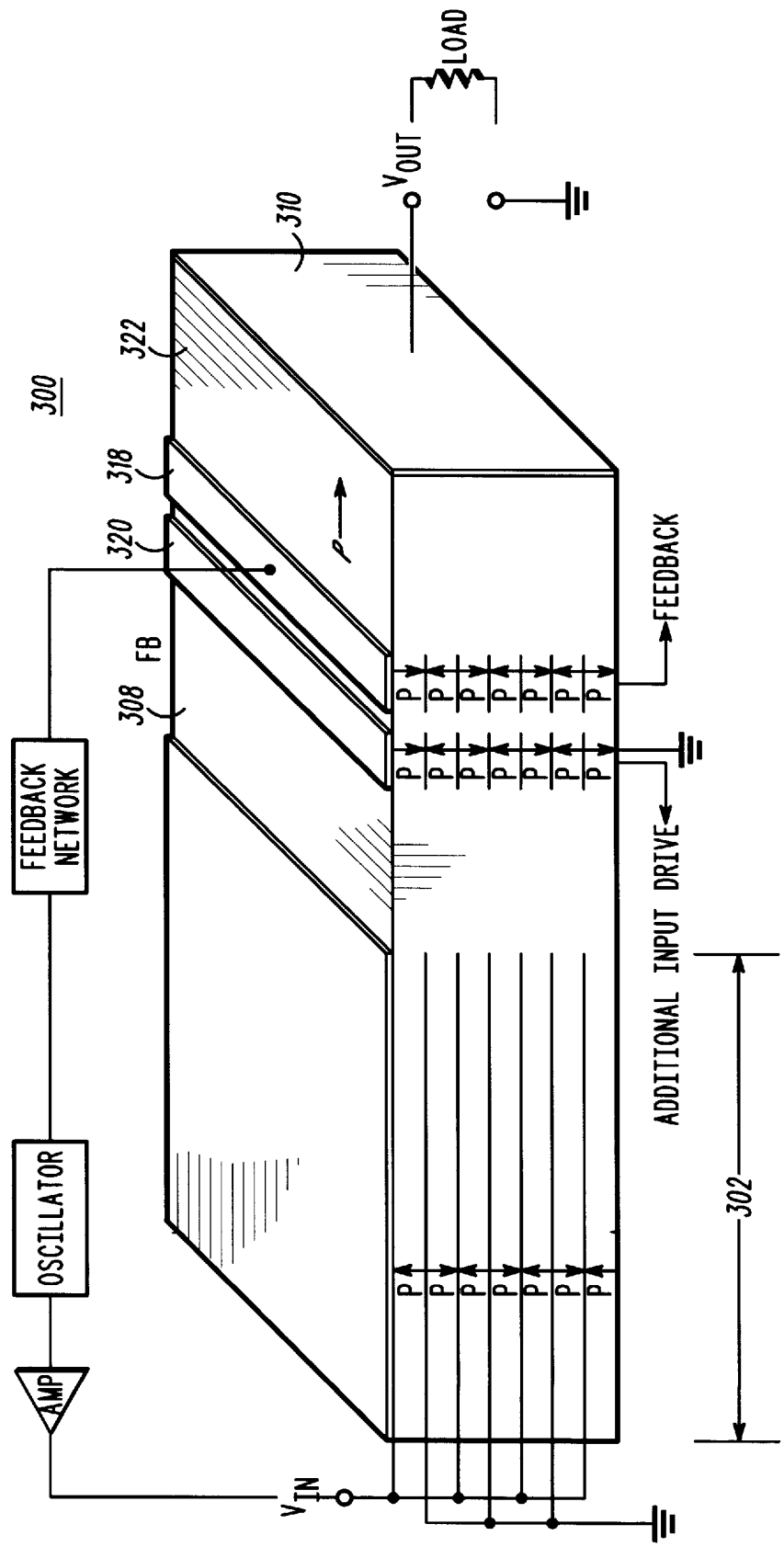
FIG. 3 shows another embodiment of a piezoelectric transformer with a voltage feedback in accordance with the present invention.

FIG. 3 shows another embodiment of a piezoelectric transformer 300 with an isolated voltage feedback section. In this embodiment, the driving section 302 of the transformer is similar to the driving section of transformer 200 shown in FIG. 2. The discussion of FIG. 2 relating to the driving section is therefore incorporated herein by reference. Additionally, the discussion of the feedback control circuit of FIG. 2, which has a feedback network, oscillator, and power amplifier, is also incorporated into this discussion of FIG. 3. Moreover, the unpolarized dielectric section 308, as well as the normally polarized dielectric section 322 and the output voltage ($V_{OUT}$) on the end face 310 are also similar for FIGS. 2 and 3.

An important aspect of FIG. 3 is that sections 318 and 320 are separated from each other despite the fact that they are both electroded through every layer of the transformer 300. Voltage feedback section 318 comprises a plurality of piezoelectric layers having internal interdigitated electrode layers which serve the purpose of providing a voltage feedback for the transformer 300. Section 320 also comprises a plurality of piezoelectric layers having internal interdigitated electrode layers which serve an entirely different purpose of providing additional input drive for the transformer 300. Section 320 may be grounded as is shown in FIG. 3. The area between the voltage feedback section 318 and the additional input drive 320 is unpolarized and both the voltage feedback section 318 and the additional input drive 320 are poled oppositely to the driving section 302.

Figure 4:
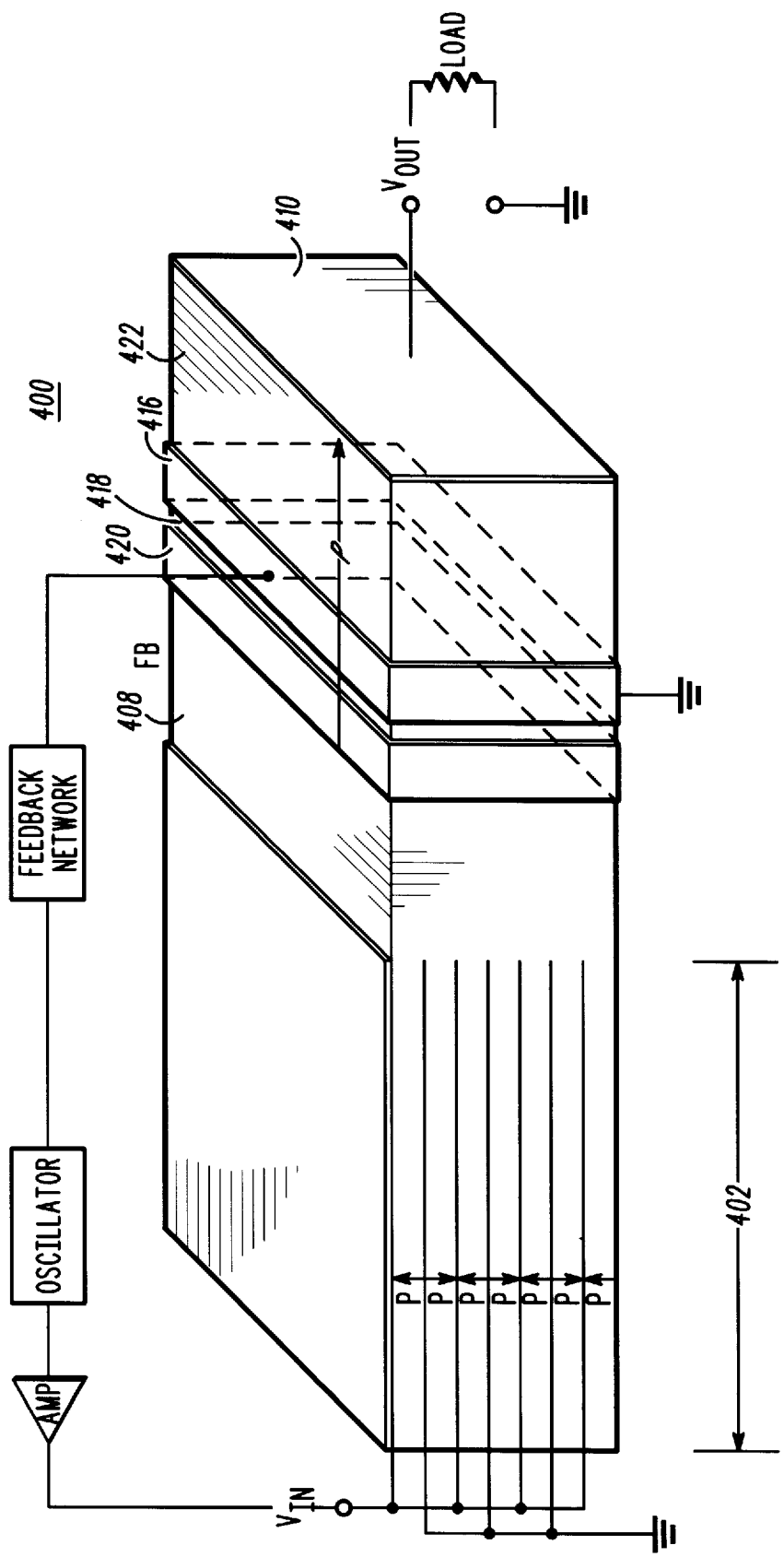
FIG. 4 shows a piezoelectric transformer with a voltage feedback outer strip in accordance with the present invention.

FIG. 4 shows still another embodiment of the a piezoelectric transformer with a voltage feedback. However, in this embodiment, the voltage feedback takes the form of an outer strip. In other words, while the outer surfaces of the transformer 400 in the region of the feedback are metallized or electroded, the internal layers may not be electroded. Referring to FIG. 4, a piezoelectric transformer 400 is provided which has a driving section 402 which is substantially the same as FIGS. 2 and 3. The polarization of the driving section 402 is shown by arrows in FIG. 4. The unpolarized dielectric section 408 and the normally polarized dielectric section 422 as well as the end face 410 with its corresponding voltage output ($V_{OUT}$) is also similar to FIGS. 2 and 3. Moreover, the feedback control circuit, which includes a feedback network, an oscillator and an amplifier are also similar to FIGS. 2 and 3. The previous discussion of these aspects of piezotransformer 400 are incorporated herein by reference.

The way in which the embodiment shown in FIG. 4 differs from the other embodiments can best be understood with reference to the voltage feedback outer strip 420, the voltage feedback region 418, and the ground electrode outer strip 416. Although the outer surfaces of the piezoelectric transformer are metallized, the dashed lines in FIG. 4 show that there is no internal metallization (electrodes) in this voltage feedback in the preferred embodiment. However, in other embodiments of the present invention, the voltage feedback outer strip and the ground electrode outer strip may further contain a plurality of internal metallization layers to increase capacitance and provide a stronger feedback signal.

It should be noted, however, that the entire transformer 400, from the unpolarized dielectric section 408 to the end face 410 is polarized in a direction normal to the thickness dimension of the transformer 400. This is shown with an arrow in FIG. 4. Ground electrode outer strip 416 serves as a ground and a voltage is measured across the voltage feedback region 418. Although this embodiment has a physical implementation which is different from the other figures, this embodiment still provides an independent voltage feedback which is highly desirable for the reasons discussed above.

Figure 5:
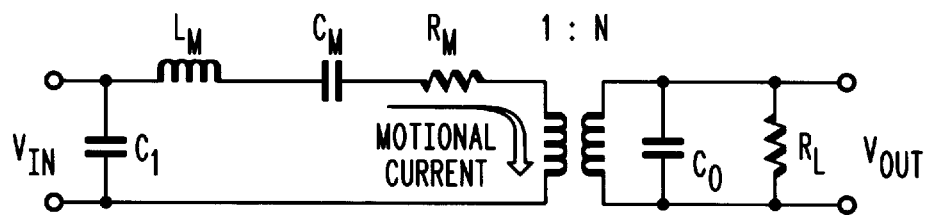
FIG. 5 shows a transformer equivalent circuit for a piezoelectric transformer without an isolated voltage feedback.

FIG. 5 shows a simple equivalent circuit for a piezoelectric transformer. Shown on this circuit are the input voltage ($V_{IN}$), input capacitance ($C_I$), mass ($L_M$), mechanical compliance ($C_M$), motional resistance ($R_M$), Piezoelectrical-mechanical/Mechanical-electrical turns ratio (N), output capacitance ($C_O$), load resistance ($R_L$), and output voltage ($V_{OUT}$). The motional current is shown with a curved arrow in FIG. 5. It should be noted that in this circuit, a significant change in ($R_L$) with respect to ($C_O$) will result in a significant change in the resonant frequency of the transformer, as well as a significant change in the phase of the output signal with respect to the input signal at the resonant frequency.

Figure 6:
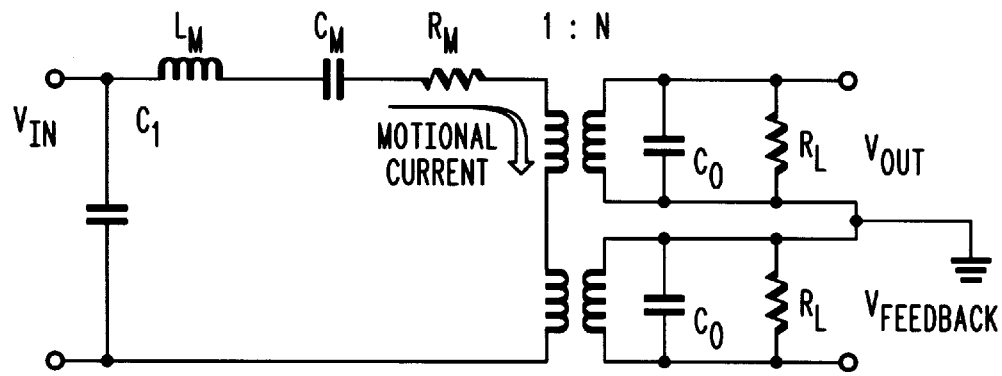
FIG. 6 shows a transformer equivalent circuit for a piezoelectric transformer with an isolated voltage feedback.

FIG. 6 shows the effect of adding an isolated voltage feedback tab on the simple equivalent circuit for a piezoelectric transformer. Many of the components of the circuit are the same as provided in FIG. 5, and those components are incorporated by reference into FIG. 6. The circuit in FIG. 6 also shows a feedback voltage ($V_{FEEDBACK}$) as well as a feedback resistance ($R_{FB}$). In the circuit of FIG. 6, the resonant frequency and the output signal phase will change with a change in ($R_L$) as was discussed in FIG. 5. However, the voltage feedback tab (voltage feedback section) monitors the motional current rather than the output current. Therefore, the feedback signal will accurately represent the frequency and phase of the motional current at resonance independent of any changes in the load. While the equivalent circuit model of a piezoelectric transformer with an independent feedback tab may be known, the present invention provides a design which implements this model in a practical piezoelectric transformer device.

The piezoelectric transformer with voltage feedback of the present invention does have, however, certain characteristics which are common among many piezotransformers. The transformer will operate as either a step-up or a step-down type transformer, depending upon its intended application. The transformer will also be made from a piezoelectric ceramic material. Some embodiments may have transformers made from lead titanate, lead titanate-lead zirconate, or barium titanate. Of course, the transformer of the present invention may be made from any material that exhibits piezoelectric properties. Finally, the resonance of the transformer may vary according to the specific application for which the transformer is designed. Certain embodiments may resonate as half-wave, full-wave, one-and-one-half wave resonators. Other resonant configurations may be utilized for other custom applications.

Although various embodiments of this invention have been shown and described, it should be understood that variations, modifications and substitutions, as well as rearrangements and combinations of the preceding embodiments can be made by those skilled in the art without departing from the novel spirit and scope of this invention.

What is claimed is:

1. A piezoelectric transformer with voltage feedback, comprising:

a piezoelectric plate of a predetermined length, width, and height made of a piezoelectric ceramic material comprising:

a driving section about one-half the length of the piezoelectric plate formed by alternately stacking a plurality of piezoelectric ceramic layers polarized in a direction of thickness of the piezoelectric plate, the driving section having internal interdigitated electrode layers for causing a piezoelectric vibration by a driving voltage applied to a first and a second input terminal;

a driven section about one-half the length of the piezoelectric plate including an unpolarized dielectric section longitudinally adjacent to the driving section and a voltage feedback section longitudinally adjacent to the unpolarized dielectric section and a normally polarized dielectric section longitudinally adjacent to the voltage feedback section;

the unpolarized dielectric section comprising a plurality of piezoelectric ceramic layers transmitting the piezoelectric vibration from the driving section to the voltage feedback section and the normally polarized dielectric section;

the voltage feedback section comprising a plurality of piezoelectric layers having internal interdigitated electrode layers polarized in a direction of thickness of the piezoelectric plate;

the normally polarized dielectric section including a predetermined length and comprising a plurality of piezoelectric ceramic layers polarized in a direction normal to the thickness direction of the piezoelectric plate, for generating an output voltage at an output terminal by the piezoelectric vibration transmitted from the driving section; and a feedback control circuit connected to the voltage feedback section and the first and the second input terminals which provides an input signal at constant phase at a resonant frequency of the piezoelectric transformer.

2. The piezoelectric transformer with voltage feedback of claim 1 wherein the feedback control circuit comprises a feedback network, an oscillator, and a power amplifier.

3. The piezoelectric transformer with voltage feedback of claim 1 wherein the internal interdigitated electrode layers of the driving section and the internal interdigitated electrode layers of the voltage feedback section are polarized in a single operation.

4. The piezoelectric transformer with voltage feedback of claim 1 wherein the internal interdigitated electrode layers of the driving section and the internal interdigitated electrode layers of the voltage feedback section are polarized in a two step operation.

5. The piezoelectric transformer with voltage feedback of claim 1, wherein the voltage feedback section is provided in the driven section of the piezoelectric plate.

6. The piezoelectric transformer with voltage feedback of claim 1, wherein the internal interdigitated electrode layers of the voltage feedback section are different in number than the internal interdigitated electrode layers of the driving section of the piezoelectric transformer.

7. The piezoelectric transformer with voltage feedback of claim 1, wherein the voltage feedback section is about one-half of a total length of the driven section of the piezoelectric plate.

8. The piezoelectric transformer with voltage feedback of claim 1, wherein the voltage feedback section is sufficiently distant from the driving section such that capacitive coupling is reduced.

9. The piezoelectric transformer with voltage feedback of claim 8, wherein the unpolarized dielectric section has a length which is about four times greater than the height of one of the piezoelectric ceramic layers of the driving section of the piezoelectric plate.

10. The piezoelectric transformer with voltage feedback of claim 1, wherein the voltage feedback section comprises a first plurality of piezoelectric layers having internal interdigitated electrode layers providing an additional input drive and a second plurality of piezoelectric layers having internal interdigitated electrode layers providing a voltage feedback.

11. The piezoelectric transformer with voltage feedback of claim 1, used in a computer backlight application.

12. The piezoelectric transformer with voltage feedback of claim 1, wherein an output from the voltage feedback section is measured in milliwatts.

13. The piezoelectric transformer with voltage feedback of claim 1, wherein an output from the voltage feedback section reduces higher order harmonic modes in the piezoelectric transformer.

14. The piezoelectric transformer with voltage feedback of claim 1, wherein a predetermined length to width ratio of the piezoelectric transformer is provided to minimize the harmonic modes and improve the efficiency of the piezoelectric transformer.

15. The piezoelectric transformer with voltage feedback of claim 14, wherein the length to width ratio of the piezoelectric transformer is 4:1.

16. The piezoelectric transformer with voltage feedback of claim 14, wherein the length to width ratio of the piezoelectric transformer is 8:1.

17. The piezoelectric transformer with voltage feedback of claim 1, wherein the piezoelectric plate resonates as at least one of a half-wave, a full-wave, and a one-and-one-half wave resonator.

18. The piezoelectric transformer with voltage feedback of claim 1, wherein the piezoelectric ceramic material is at least one of lead titanate, lead titanate-lead zirconate ($PbZrO_3$—$PbTiO_3$), and barium titanate.

19. The piezoelectric transformer with voltage feedback of claim 1, wherein the transformer is a step-up type transformer.

20. The piezoelectric transformer with voltage feedback of claim 1, wherein the transformer is a step-down type transformer.

21. The piezoelectric transformer with voltage feedback of claim 1, wherein the driven section of the piezoelectric plate is selectively polarized to provide a predetermined output voltage.

22. A piezoelectric transformer with voltage feedback, comprising:

a piezoelectric plate of a predetermined length, width, and height made of a piezoelectric ceramic material comprising:

a driving section about one-half the length of the piezoelectric plate formed by alternately stacking a plurality of piezoelectric ceramic layers polarized in a direction of thickness of the piezoelectric plate, the driving section having internal interdigitated electrode layers for causing a piezoelectric vibration by a driving voltage applied to a first and a second input terminal;

a driven section about one-half the length of the piezoelectric plate including an unpolarized dielectric section longitudinally adjacent to the driving section and a voltage feedback outer strip longitudinally adjacent to the unpolarized dielectric section and a voltage feedback region longitudinally adjacent to the voltage feedback outer strip and a ground electrode outer strip longitudinally adjacent to the voltage feedback region and a normally polarized dielectric section longitudinally adjacent to the ground electrode outer strip;

the unpolarized dielectric section comprising a plurality of piezoelectric ceramic layers transmitting the piezoelectric vibration from the driving section to the voltage feedback section and the normally polarized dielectric section;

the voltage feedback outer strip comprising a strip of metallization around an outer surface of the piezoelectric transformer;

the voltage feedback region comprising an area between the voltage feedback outer strip and the ground electrode outer strip, the voltage feedback region providing a voltage potential difference between the voltage feedback outer strip and the ground electrode outer strip;

the ground electrode outer strip comprising a strip of metallization around an outer surface of the piezoelectric transformer;

the normally polarized dielectric section including a predetermined length and comprising a plurality of piezoelectric ceramic layers polarized in a direction normal to the thickness direction of the piezoelectric plate, for generating an output voltage at an output terminal by the piezoelectric vibration transmitted from the driving section; and a feedback control circuit connected to the voltage feedback outer strip and the first and the second input terminals which provides an input signal at constant phase at a resonant frequency of the piezoelectric transformer.

23. The piezoelectric transformer with voltage feedback of claim 22 wherein the feedback control circuit comprises a feedback network, an oscillator, and a power amplifier.

24. The piezoelectric transformer with voltage feedback of claim 22, wherein the voltage feedback section is connected to a high impedance amplifier.

25. The piezoelectric transformer with voltage feedback of claim 22, wherein the voltage feedback outer strip and the ground electrode outer strip further contain a plurality of internal metallization layers.

* * * * *